(12) United States Patent
Gardner et al.

(10) Patent No.: US 6,225,646 B1
(45) Date of Patent: May 1, 2001

(54) INTEGRATED CIRCUIT INCORPORATING A MEMORY CELL AND A TRANSISTOR ELEVATED ABOVE AN INSULATING BASE

(75) Inventors: Mark I. Gardner, Cedar Creek; H. Jim Fulford, Austin, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/483,557

(22) Filed: Jan. 14, 2000

(51) Int. Cl.[7] .............................. H01L 33/00; H01L 29/78
(52) U.S. Cl. .............................. 257/59; 257/374; 257/776
(58) Field of Search ............................... 257/59, 374, 776

(56) References Cited

U.S. PATENT DOCUMENTS

| | | |
|---|---|---|
| 4,630,089 | * 12/1986 | Sasaki et al. . |
| 5,168,072 | 12/1992 | Moslehi . |
| 5,321,286 | * 6/1994 | Koyama et al. . |
| 5,504,031 | 4/1996 | Hsu et al. . |
| 5,742,075 | 4/1998 | Burns et al. . |
| 5,773,358 | 6/1998 | Wu et al. . |
| 6,015,990 | * 1/2000 | Hieda et al. . |

FOREIGN PATENT DOCUMENTS

| | | |
|---|---|---|
| 0 544 204 | 6/1993 | (EP) . |
| 6-188394 | 7/1994 | (JP) . |

OTHER PUBLICATIONS

Kong et al., "An EPROM Cell with a Magnesium Electronic Injector," © 1995 IEEE, pp. 456–459.
"SOI Interposer Structure," IBM® Technical Disclosure Bulletin, vol. 39, No. 7, Jul. 1996, pp. 191–195.

* cited by examiner

Primary Examiner—Stephen D. Meier
(74) Attorney, Agent, or Firm—Kevin L. Daffer; Conley, Rose & Tayon P.C.

(57) ABSTRACT

An integrated circuit is presented. The integrated circuit may include a memory cell formed above an insulating base. The insulating base may either be arranged above a substrate or serve as a substrate itself. A transistor may be arranged above the memory cell. The transistor is preferably dielectrically isolated from the memory cell. In a preferred embodiment, a segmented substrate is arranged between the memory cell and transistor. The segmented substrate preferably includes a first conductive substrate layer arranged above and dielectrically spaced from the memory cell. A second conductive substrate layer may be formed above the first conductive substrate layer. The transistor may be arranged upon and within the second conductive substrate layer. Preferably, the segmented substrate further includes an intersubstrate dielectric layer interposed between the second conductive substrate layer and the first conductive substrate layer. The intersubstrate dielectric layer preferably serves to insulate the first conductive substrate layer from the second conductive substrate layer. An integrated circuit so configured may be fabricated with greater device density at reduced cost.

20 Claims, 9 Drawing Sheets

INTEGRATED CIRCUIT INCORPORATING A MEMORY CELL AND A TRANSISTOR ELEVATED ABOVE AN INSULATING BASE

BACKGROUND OF THE INVENTION

1. Field of the Invention

This invention relates to integrated circuit fabrication, and, more particularly, to microelectronic topographies incorporating memory cells and transistors and methods for fabricating such topographies.

2. Description of the Related Art

Unless specifically designated as prior art, the information described below is not admitted to be prior art by virtue of its inclusion in this Background section.

Memory circuits can be used to store and retrieve large quantities of electronic information. These circuits typically store each separate bit of information in storage elements called memory cells. Consequently, the capacity of a memory circuit is often described in terms of the number of bits that a circuit can store. In addition, memory circuits are often classified as being either volatile or non-volatile. Generally speaking, volatile memory circuits contain memory cells that cannot retain information for a substantial amount of time if the power supply is interrupted; non-volatile memory circuits contain memory cells which can retain information for a substantial amount of time if the power supply is interrupted.

Non-volatile memory circuits are generally structured as read-only memory ("ROM"), a memory configuration in which data retrieval time is relatively short but data entry time is relatively long (if data entry is possible at all). Masked ROMs, generally referred to only as ROMs, are read-only memories into which data is entered during manufacturing and that cannot be subsequently altered. Conversely, programmable ROMs ("PROMs") allow entry of data after manufacturing is complete. Several technologies may be used to form non-volatile memory circuits, including bipolar or metal oxide semiconductor ("MOS") technologies. Examples of MOS PROM technologies include erasable programmable ROM ("EPROM"), electrically erasable programmable ROM ("EEPROM"), and flash memory EEPROM ("FLASH EEPROM").

Non-volatile MOS PROMs may be configured using a variety of different designs. Some of the more widely used designs for such PROMs include floating gate tunnel oxide ("FLOTOX"), textured polysilicon, metal nitride oxide silicon ("MNOS"), and EPROM—tunnel oxide ("ETOX") designs. The particular design used for a cell may determine the manner by which the cell stores charge, as well as how the cell is programmed or erased. For example, FLOTOX EEPROM memory cells are generally programmed (moving electrons into the floating gate) by biasing the control gate, and such memory cells are generally erased (moving electrons out of the floating gate) by biasing the drain. Conversely, MNOS memory cells store charge in discrete traps within the bulk of a nitride layer formed above a thin oxide layer. Programming and erasure of such cells are accomplished by inducing electron tunneling between the nitride bulk and the substrate.

FIG. 1 illustrates a FLOTOX EEPROM memory cell according to a conventional design. The FLOTOX cell includes a relatively thin tunneling oxide 102 interposed between a doped polysilicon floating gate 104 and a silicon substrate 100. Tunneling oxide 102 is typically thermally grown upon substrate 100 to a thickness of less than, for example, 100 angstroms. The FLOTOX cell further includes an interpoly oxide 106 arranged upon floating gate 104 and underlying a doped polysilicon control gate 108. Fabrication of the FLOTOX cell may involve forming these layers above silicon substrate 100 and then etching away portions of the layers not masked by a patterned photoresist layer to form the stacked structure shown in FIG. 1. A heavily concentrated dopant distribution that is self-aligned to the opposed sidewalls of the stacked structure may then be forwarded into substrate 100 to form source and drain regions 110 and 112, respectively. An oxide layer 114 may be thermally grown upon the periphery of the stacked structure and upon exposed regions of substrate 100. Due to exposure to thermal radiation during this process, the impurities within source and drain regions 110 and 112 undergo lateral migration toward the channel region underneath tunneling oxide 102, resulting in the configuration depicted in FIG. 1.

In subsequent processing, control gate 108 may be coupled to a word line conductor and bit line conductors can be formed within contact windows of oxide layer 114 for contacting drain region 112. Floating gate 104 can then be programmed by grounding source and drain regions 110 and 112 and applying a relatively high voltage to control gate 108. During programming, electrons from the substrate pass through tunneling oxide 102 to floating gate 104 by a tunneling mechanism known as Fowler-Nordheim tunneling. As more electrons accumulate in floating gate 104, the electric field is reduced and the flow of electrons to floating gate 104 decreases. Programming of the memory cell is performed for a time sufficient to build up a desired charge level on the floating gate. Discharge of floating gate 104 to erase the cell can be achieved by grounding control gate 108, floating gate 104, and source region 110, and then applying a relatively high voltage to drain region 112.

In summary, both programming and erasure of FLOTOX EEPROMs, as well as other types of conventional memory cells, involve the transfer of electrons to and from a semiconducting substrate. More specifically, electron transfer in such conventional memory cells often occurs between junctions (e.g., source region 110 and drain region 112) and a conductive gate (e.g., floating gate 104). Consequently, these conventional memory cells must be formed upon and within a semiconductor substrate; that is, in the surface plane of the semiconductor substrate. Typically, the semiconductor substrate is a single-crystal silicon wafer.

Unfortunately, single-crystal silicon wafers have a limited amount of surface area available for the formation of memory cells. One reason for the limited surface area is that the diameter of the silicon wafers used in integrated circuit manufacture is often restricted by equipment concerns or other factors. Because FLOTOX-type conventional memory cells are formed in the surface plane of a wafer, the number of such cells that can be formed on the wafer will be limited to the available wafer surface area. Furthermore, the junctions necessary for FLOTOX-type memory cells occupy even more of the valuable wafer surface area. Consequently, to achieve a particular storage capacity conventional memory circuits are often formed on larger chips than might otherwise be desired. Greater chip size, of course, reduces the number of chips that can be obtained from a wafer of a given diameter, and thus can increase the cost of each chip fabricated from the wafer.

The limitations of conventional memory cells are also problematic when trying to implement such cells as on-chip memory for microprocessors. Current microprocessors typically include memory cells on the same chip as the logic circuitry (e.g., to act as a high-speed cache); memory cells used in such a manner are often referred to as on-chip memory. On-chip memory is typically provided using conventional memory cell designs (such as those discussed above) in which the memory cells are located in the surface plane of a silicon wafer. The conventional MOSFET transistors used in the logic circuitry of the microprocessor conduct current between junctions formed in the silicon wafer, and as such are also formed in the surface plane of a silicon wafer.

The need to place conventional transistors and memory cells on the surface plane of the same silicon wafer necessarily limits the maximum number of each device type that may be included in a given chip area on the wafer. As a result, the size of chips that incorporate significant on-chip memory must often be undesirably increased to accommodate a certain quantity of memory cells while still allowing sufficient space for the desired number of transistors. This increase in chip area, as noted above, typically results in a higher cost for the final microprocessor. Moreover, the present trend toward increased quantities of on-chip memory only exacerbates this problem.

Furthermore, placing transistors and memory cells on the wafer surface plane can complicate the integrated circuit fabrication process. For example, FLOTOX type memory cells include, as shown above, stacked layers of polysilicon separated by oxide layers. Therefore, when deposited or grown layers are etched to form such memory cells, a stacked etch must be performed that passes through multiple layers of polysilicon and oxide. MOSFETs, however, typically only include one layer each of polysilicon and oxide, and thus require a different and shorter etch process than do FLOTOX memory cells. Since the etch processes for conventional memory cells and transistors may be substantially different, the need to accommodate the different configurations and thicknesses of the structures when both types are present on the surface can complicate the fabrication process. Given the need for high accuracy in integrated circuit manufacturing, and in particular with the lateral dimensions of transistors, this increased complexity can undesirably affect the final integrated circuit.

In addition, transistors and memory cells often have different process condition requirements, and the presence of both on the same surface plane can prevent the optimal fabrication of either. For example, the total amount of thermal energy to which a device is exposed during fabrication is often tracked using a term called the thermal budget. The thermal budget for a device may be calculated as simply the product of the temperature of a processing step and the length of time for which the processing step maintains that temperature, for all processing steps to which a device is exposed during its fabrication. The optimal thermal budget for memory cells and transistors, though, may differ significantly: For example, the ideal post-doping anneal temperature for memory cells can be much higher than that for transistors.

In an attempt to accommodate the requirements of both device types, anneals in such situations are often done at a temperature below what would be optimal for the memory cell and above what would be optimal for the transistors. In other words, the ideal anneal conditions for both device types are often compromised by presence of large numbers of both devices types on the wafer surface plane. As might be expected, this situation can hinder the fabrication of an optimally configured integrated circuit.

Finally, single-crystal silicon wafers are relatively expensive—particularly when compared to wafers made from other materials such as ceramics. The higher cost of single-crystal silicon wafers largely stems from the exacting nature of their fabrication process. Great care must be taken during wafer fabrication if electronic grade silicon wafers with a desired purity and crystal orientation are to be obtained, and the demanding requirements of silicon wafer fabrication contribute substantially to the relatively high cost of single-crystal silicon wafers. But since most conventional memory cells and transistors are designed to be fabricated in the surface plane of a single-crystal silicon wafer, the purchase of such wafers cannot be avoided as long as manufacturers are dependent on conventional transistor and memory cell designs.

Therefore, it would be desirable to develop memory cells and transistors that are not required to be located in the surface plane of a single-crystal silicon substrate. It would also be desirable to design an integrated circuit that incorporates such devices and thus does not require the use of single-crystal silicon, or any other semiconducting material, as a substrate. It would further be desirable to create an integrated circuit that has both memory cells and transistors but does not require both device types to be arranged within the same plane. An integrated circuit so configured could be fabricated at reduced cost and with less complicated processing techniques.

SUMMARY

The problems discussed above are in large part resolved by the present integrated circuit and method for fabricating such an integrated circuit. The integrated circuit preferably includes a memory cell formed above an insulating base. The insulating base may either be arranged above a substrate or serve as a substrate itself. A transistor may be arranged above the memory cell. The transistor is preferably dielectrically isolated from the memory cell. An integrated circuit so configured may be fabricated with greater device density at reduced cost.

The integrated circuit preferably includes a segmented substrate arranged between the memory cell and the transistor. The segmented substrate may be a composite of one or more layers, and is preferably capable of serving as a functional substrate for memory cells and transistor. That is, while the segmented substrate may not serve a normal function of a substrate of providing undermost support for the fabrication of an integrated circuit, the segmented substrate is preferably configured to provide operational functions of a substrate with regard to both device types. For example, the segmented substrate preferably allows the formation of a conductive channel therein for the operation of a transistor, and may serve as a source and/or destination of electrons for the operation of a memory cell. In addition, the segmented substrate preferably provides dielectric isolation between the memory cell and the transistor during operation of the integrated circuit.

In an embodiment, the segmented substrate includes a first conductive substrate layer arranged above and dielectrically spaced from the memory cell. Dielectric spacing of the memory cell from the first substrate conductive layer may be provided by a program dielectric arranged upon the upper surface of the memory cell. Additionally, the first conductive substrate layer preferably extends beyond the lateral dimensions of the memory cell. A second conductive substrate layer may be formed above the first conductive substrate layer. The transistor may be arranged upon and within the second conductive substrate layer. Preferably, the segmented substrate further includes an intersubstrate dielectric layer interposed between the second conductive substrate layer and the first conductive substrate layer. The intersubstrate dielectric layer preferably serves to insulate the first conductive substrate layer from the second conductive substrate layer during operation of the integrated circuit.

The present integrated circuit preferably incorporates memory cells and transistors that are not required to be formed in the surface plane of a single-crystal silicon wafer, thus allowing for increased device density. As noted above, the present integrated circuit includes memory cells and transistors that may be formed above, and preferably upon, an insulating base, instead of upon and within a semiconductor substrate. Being so configured, the number of memory cells and transistors that can be formed above a single substrate as part of the integrated circuit is not limited by the surface area available in the substrate plane. This feature may enable the fabrication of an integrated circuit with a significantly higher device density (i.e., number of the memory cells and transistors for a given chip area), thus allowing the use of smaller chips that may be produced at a lower fabrication cost.

In addition, the present integrated circuit preferably does not require the use of a semiconductor substrate at all. In an embodiment, the insulating base may be a dielectric substrate capable of supporting the formation of memory cells and transistors thereabove. In such a case, the insulating base is preferably a ceramic substrate, such as a silicon dioxide wafer. Since, as mentioned above, these wafers are usually less expensive than a single-crystal silicon wafer, this aspect of the total integrated circuit fabrication cost can also be greatly reduced.

Moreover, the present integrated circuit preferably provides for memory cells and transistors that are not required to be formed within the same plane. The integrated circuit preferably includes at least one transistor arranged elevationally above and dielectrically isolated from an underlying memory cell. (The transistors, however, are not required to directly overly the memory cell.) As such, the number of transistors and memory cells that may be fabricated above a single plane is not limited by the amount of space available within any particular plane.

And since the transistors and memory cells of the present integrated circuit may be formed in separate planes, each type of device may be fabricated using fabrication conditions optimized for that particular device type. One disadvantage mentioned above of conventional transistors and memory cells was that their fabrication conditions are too often compromised from what might be optimal for each device type, a situation that largely results from the need to expose both device types in the same surface plane to the same processing conditions. The present integrated circuit, however, preferably allows transistors to be fabricated in an upper plane above the plane of the memory cells and after memory cells are fabricated, so the processing conditions for the fabrication of each device type (e.g., thermal budget) may be optimized—potentially to a level impractical or even impossible with conventional designs.

For example, during the fabrication sequence the integrated circuit (i.e., the microelectronic topography that may subsequently become a functioning integrated circuit) may be annealed at a first maximum temperature (i.e., the highest temperature within the time period specified) after said forming a memory cell but before said forming a transistor. The integrated circuit may be subsequently annealed at a second maximum temperature lower than said first maximum temperature after, for example, depositing a second conductive substrate layer (e.g., after dopant implantation to form transistor junctions). In such a manner, differing thermal budget requirements for the memory cells and transistors may be optimally accounted for. And because the memory cells and transistors may be formed in different planes, the patterning of the memory cells and transistors may be efficiently done for each device type independently, thus avoiding the problem often present in conventional designs of needing different etch times and configurations for each device type.

As implied above, the present integrated circuit may include memory cells and transistors that may be operated without transferring electrons between or within a single-crystal silicon wafer. That is, a memory cell of the present integrated circuit may be programmed, read, and erased, and a transistor of the present integrated circuit may be switched on or off, without transferring electrons between or within a single-crystal silicon wafer. (Again, however, the insulating base may be formed above a single-crystal silicon wafer having transistors and/or memory cells in its surface plane that may transfer electrons between or within the single-crystal silicon wafer.)

In an embodiment, the memory cell may be used to store a charge level representing digital information; preferably, the memory cell is configured for non-volatile charge storage. Programming and erasure of the memory cell may be accomplished in various ways. In an embodiment, programming, or writing, of the memory cell may involve applying a positive potential to the memory cell while grounding the first conductive substrate layer to induce the tunneling of electrons from the first conductive substrate layer to the memory cell through the program dielectric. (Preferably, such programming may be performed without substantially altering a charge level on any other, possibly adjacent, memory cells.) Conversely, erasure of the memory cell may involve applying a positive potential to the first conductive substrate layer while grounding the memory cell to induce tunneling of electrons from the memory cell though the program dielectric and back to the first conductive substrate layer. The state of the memory cell may be read by sensing the charge on the memory cell at a given moment in time. Each of the memory cells may be used to store one bit, and the charge level read from the cell may be used to determine whether the cell represents a "1" or a "0" at a given point in time.

In an embodiment, programming data to the memory cell may be time multiplexed with reading data from the memory cell. In either instance, the memory cell may offer a capacitive storage area, and therefore may suffice as (or may be coupled to) a word line when programming data (i.e., writing data) and thereafter a bit line when reading the non-volatile, programmed data. Thus, the memory cell may be utilized in a set of spaced, programmable memory cells, which can be arranged in either a matrix or cross-hatched pattern or as a series of co-linear pairs of memory cells.

An EPROM or EEPROM arranged in this manner would therefore employ a word-line decoder coupled to the memory cell to selectively program at least one memory cell from among a plurality of memory cells by applying a programming voltage to the selected memory cell while grounding an overlying, dielectrically spaced first conductive substrate layer. Erasure can occur by word-line decoding a particular memory cell from among the plurality of memory cells, and applying a ground voltage thereto, while applying a positive voltage to first conductive substrate layer. Erasing a memory cell in such a manner may concurrently erase all memory cells that the first conductive substrate layer is in tunneling contact with (i.e., all memory cells that are spaced from the first conductive substrate layer by a dielectric of sufficient thickness to allow tunneling of electrons therebetween at the voltage level of the applied erasing potential). Reading of a memory cell may be accomplished by using a bit-line decoder to determine the value stored by the cell. The bit-line decoder may be configured to decode a selected bit-line (i.e., programmed memory cell) at possibly a synchronized time after the memory cell had been previously programmed.

BRIEF DESCRIPTION OF THE DRAWINGS

Other objects and advantages of the invention will become apparent upon reading the following detailed description and upon reference to the accompanying drawings in which:

FIG. 9 is a partial cross-sectional view of the microelectronic topography, in which a first conductive substrate layer is deposited upon the program dielectrics and the intracell dielectric layer according to a processing step subsequent to FIG. 8a;

Figure 1:
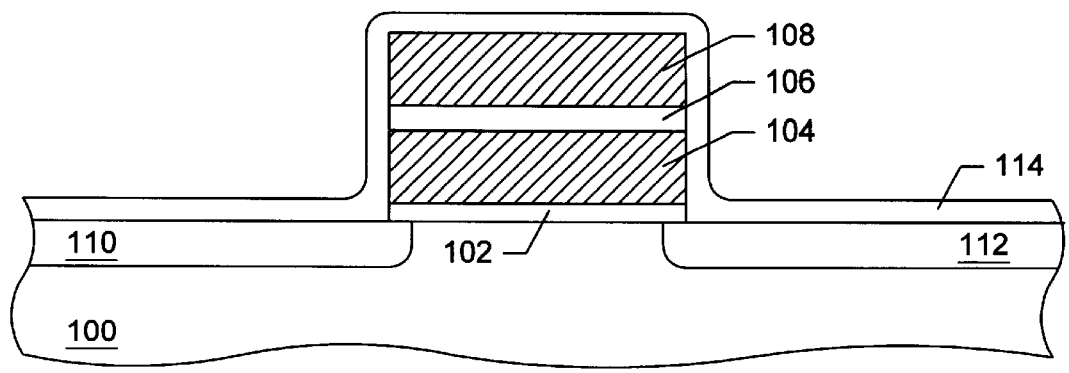
FIG. 1 is a partial cross-sectional view of a FLOTOX EEPROM memory cell according to a conventional design.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 2:
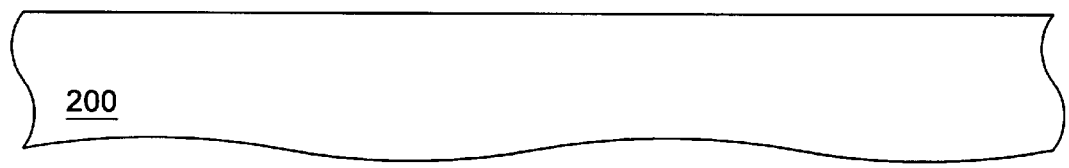
FIG. 2 is a partial cross-sectional view of a microelectronic topography in accordance with an embodiment, in which a dielectric base is shown.
Figure 22:
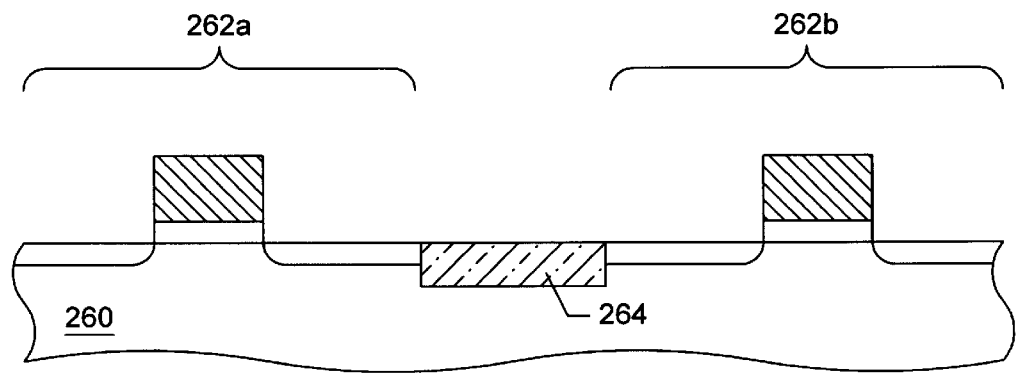
FIG. 22 is a partial cross-sectional view of a microelectronic topography in accordance with another embodiment, in which active devices are shown arranged in active regions of a semiconductor substrate and adjacent to an isolation trench formed in a field region of the semiconductor substrate.
Figure 23:
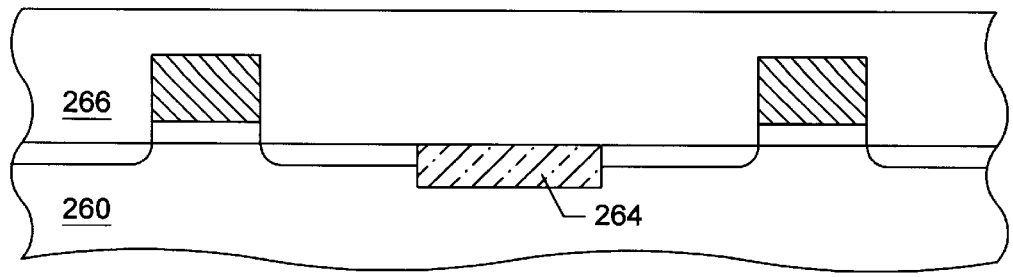
FIG. 23 is a partial cross-sectional view of the microelectronic topography, in which an insulating base is formed above the semiconductor substrate according to a processing step subsequent to FIG. 22.
Figure 24:
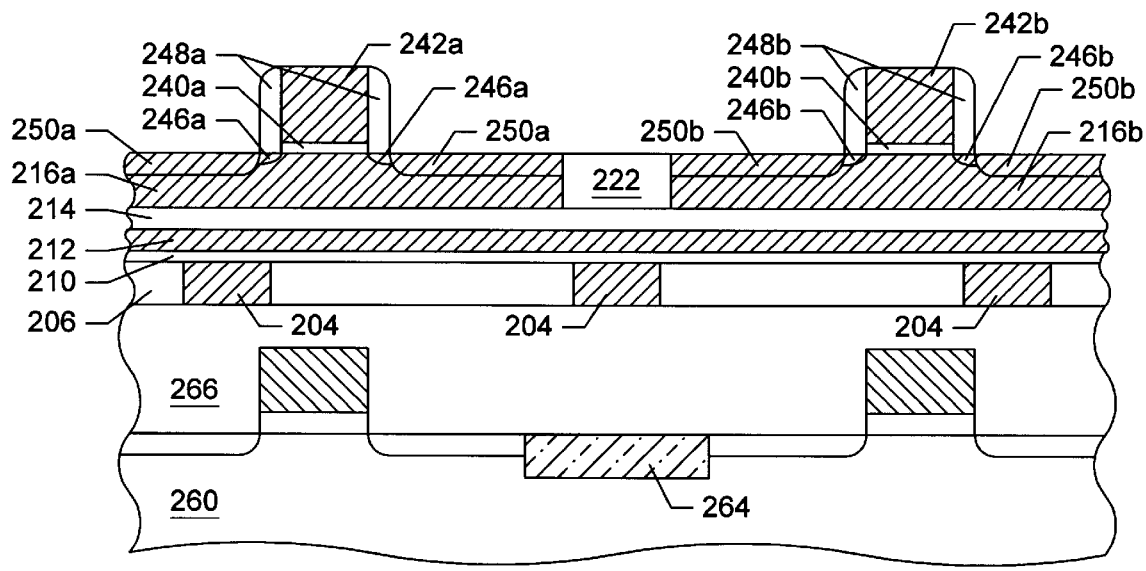
FIG. 24 is a partial cross-sectional view of the microelectronic topography, in which memory cells, a segmented substrate, and transistors are formed above the insulating base according to a processing sequence subsequent to FIG. 23.

FIG. 2 presents a partial cross-sectional view of a microelectronic topography having a dielectric base 200. (As set forth herein, a microelectronic topography may include a substrate and any layers and materials formed above the substrate from which microelectronic products (e.g., semiconductor devices) may be produced.) Insulating base 200 may be formed above a substrate, such as a semiconductor substrate, or may serve as a substrate itself (e.g., the dielectric base is capable of serving as the lowest layer of a microelectronic topography, a layer configured to support the fabrication of subsequent layers thereabove). In the embodiment depicted in FIG. 2, dielectric base 200 is configured as a substrate. However, it should be understood that a substrate, and any active and/or passive devices possibly arranged upon and within the substrate, may be arranged below dielectric base 200 in any of the processing steps shown herein. (An embodiment in which dielectric base 200 is formed above a semiconductor substrate is depicted in FIGS. 22–24, which are discussed below.) Insulating base 200 may be formed over both semiconducting and non-semiconducting substrates. In an embodiment, insulating base 200 may be formed over a non-semiconducting substrate devoid of any active devices, which may be used to support insulating base 200 during the integrated circuit fabrication sequence. Such a non-semiconducting substrate may be removed from insulating base 200 after fabrication of an integrated circuit is complete.

Insulating base 200 is preferably composed of a dielectric material suitable for insulating an integrated circuit. Suitable materials include silicon dioxide, silicon nitride, silicon oxynitride, and a variety of low dielectric constant materials. When configured as a substrate, dielectric base 200 is preferably at least 100 microns thick.

Figure 3:
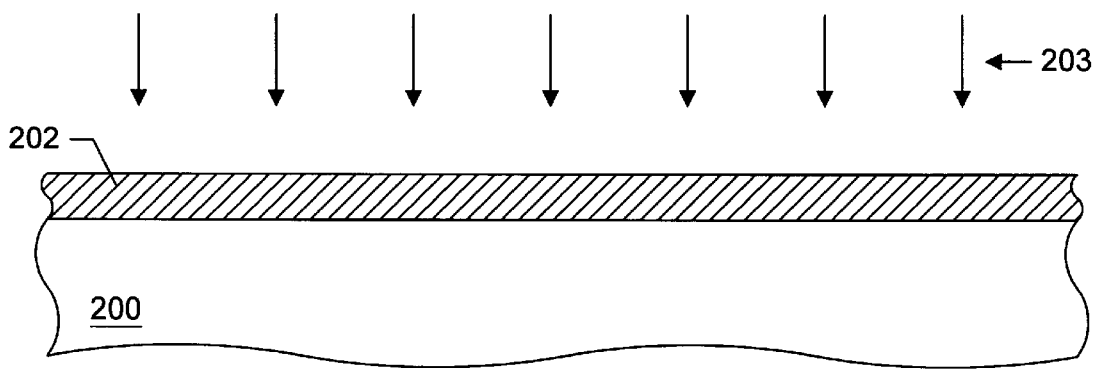
FIG. 3 is a partial cross-sectional view of the microelectronic topography, in which a memory cell conductive layer is deposited and doped according to a processing step subsequent to FIG. 2.

FIG. 3 depicts a partial cross-sectional view of a subsequent processing step in which a memory cell conductive layer is deposited above, and preferably upon, dielectric base 200, and then doped. Memory cell conductive layer 202 is preferably composed of polysilicon, but may also be composed of other conductive or potentially conductive materials, such as any of a variety of metals. Memory cell conductive layer 202 is preferably formed by CVD deposition of polysilicon. Suitable CVD techniques include low-pressure chemical vapor deposition ("LPCVD") from a silane source. After being deposited, memory cell conductive layer 202 may be slightly polished to improve planarity. Memory cell conductive layer 202 is preferably deposited sufficiently thick to allow memory cells of sufficient size to the patterned therefrom in subsequent processing. In an embodiment, memory cell conductive layer 202 is 1000–2000 angstroms thick.

Memory cell conductive layer 202 is preferably doped with n- or p-type dopants either concurrent or subsequent to its deposition. In the embodiment shown in FIG. 3, impurities 203 are introduced into memory cell conductive layer 202 via ion implantation. Alternately, the memory cell conductive layer may be doped concurrently with its deposition, or in situ. Of course, if memory cell conductive layer 202 is composed of a metal, then doping of the layer is preferably not performed.

Figure 4:
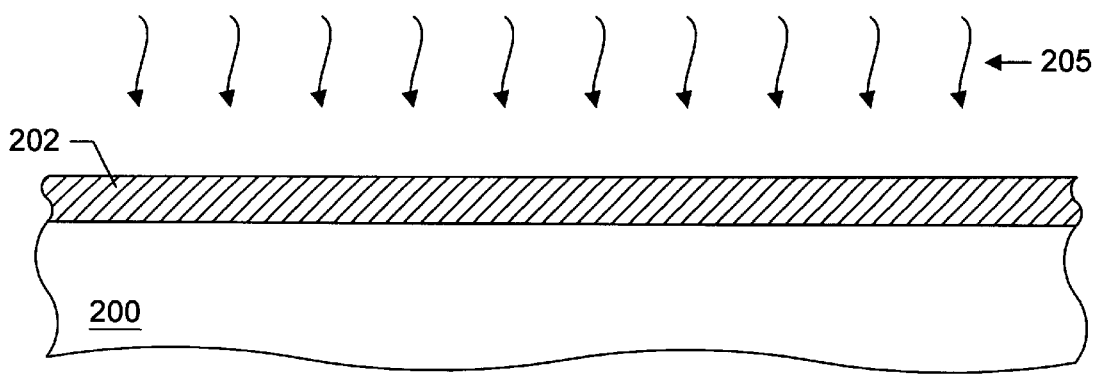
FIG. 4 is a partial cross-sectional view of the microelectronic topography, in which the microelectronic topography is exposed to thermal radiation according to a processing step subsequent to FIG. 3.

FIG. 4 depicts a partial cross-sectional view of a subsequent processing step in which the microelectronic topography is annealed by exposure to thermal radiation 205. Annealing of the microelectronic topography may be performed in a Rapid Thermal Annealing ("RTA") chamber or a tube furnace. The annealing process preferably repairs any implant damage resulting from previous ion implantation steps, e.g., ion implantation into memory cell conductive layer 202.

Figure 5:
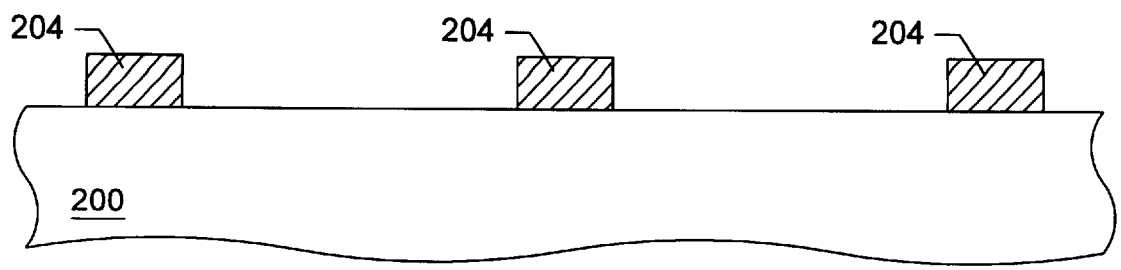
FIG. 5 is a partial cross-sectional view of the microelectronic topography, in which the memory cell conductive layer is patterned to form a plurality of memory cells upon the insulating base according to a processing step subsequent to FIG. 4.

FIG. 5 presents a partial cross-sectional view of a subsequent processing step in which memory cell conductive layer 202 is patterned to form a plurality of memory cells 204 upon insulating base 200. Memory cell conductive layer 202 is preferably patterned by appropriately configured optical lithography and plasma etching techniques. While memory cells 204 are shown in FIG. 5 as being equally spaced from each other, the spacing of adjacent memory cells may be configured as desired. In addition, any number of memory cells 204 may be patterned from memory cell conductive layer 202. For example, memory cells 204 can be patterned from memory cell conductive layer 202 in either a matrix or cross-hatched pattern, or as a series of co-linear pairs of memory cells. Memory cells 204 are preferably configured for non-volatile charge storage.

Figure 6:
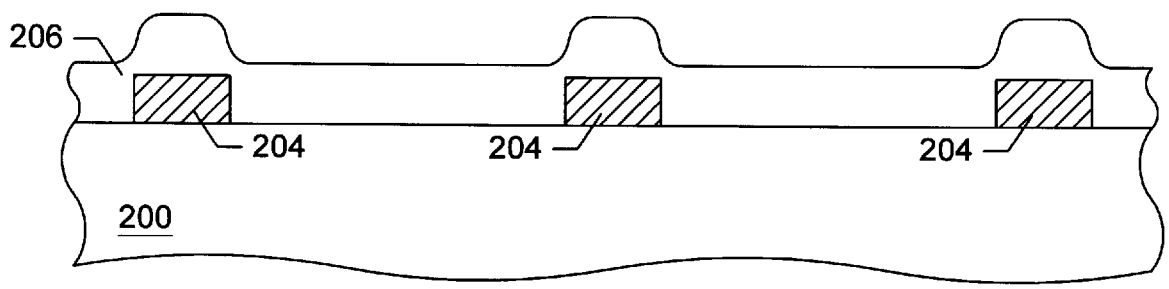
FIG. 6 is a partial cross-sectional view of the microelectronic topography, in which an intracell dielectric layer is deposited over the plurality of memory cells and the insulating base according to a processing step subsequent to FIG. 5.

FIG. 6 depicts a partial cross-sectional view of a subsequent processing step in which intracell dielectric layer 206 is deposited over and upon memory cells 204 and insulating base 200. Intracell dielectric layer 206 is preferably deposited such that it substantially fills any lateral space between adjacent memory cells 204. Intracell dielectric layer 206 is preferably configured to dielectrically isolate adjacent memory cells 204. That is, intracell dielectric layer 206 is preferably capable of substantially preventing charge transfer directly between adjacent memory cells 204 during operation (e.g., while charge is stored on a memory cell).

Figure 7:
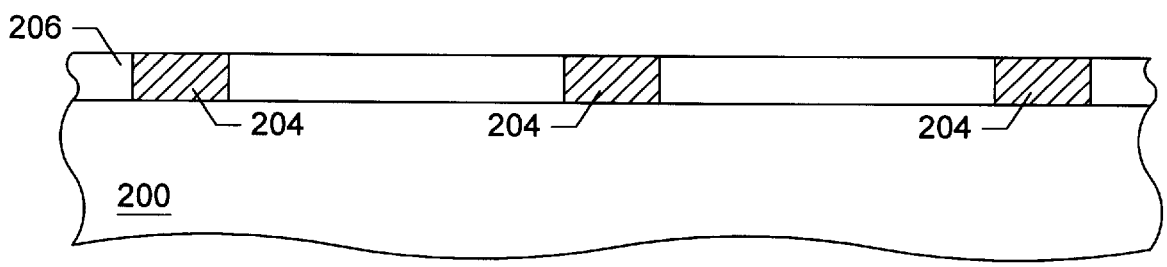
FIG. 7 is a partial cross-sectional view of the microelectronic topography, in which the intracell dielectric layer is planarized such that the upper surface of the intracell dielectric layer is substantially coplanar with the upper surfaces of the plurality of memory cells according to a processing step subsequent to FIG. 6.

FIG. 7 depicts a partial cross-sectional view of a subsequent processing step in which the intracell dielectric layer is planarized. Planarization of intracell dielectric layer 206 is preferably performed using chemical-mechanical polishing ("CMP"). After planarization, the upper surface of the intracell dielectric layer is substantially coplanar with the upper surfaces of memory cells 204 (i.e., the upper surfaces of the intracell dielectric layer and the memory cell are at substantially the same elevation).

Figure 8A:
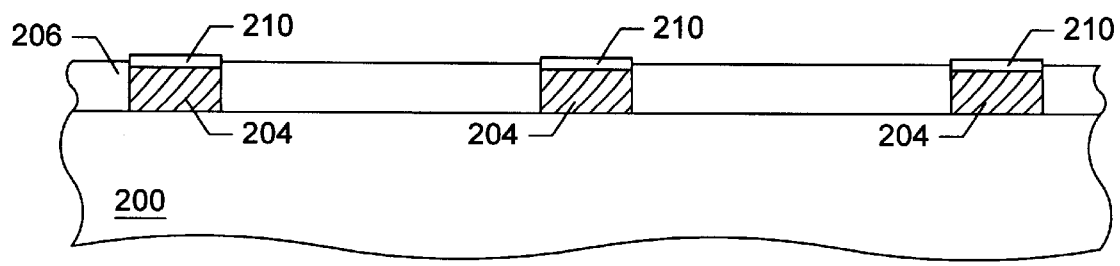
FIG. 8a is a partial cross-sectional view of the microelectronic topography, in which program dielectrics are grown upon the upper surface of each of the plurality of memory cells according to a processing step subsequent to FIG. 7.

FIG. 8a depicts a partial cross-sectional view of a subsequent processing step in which program dielectrics 210 are grown upon the upper surface of each of the plurality of memory cells in accordance with an embodiment. Program dielectrics 210 are preferably configured to allow transfer of charge, preferably by electron tunneling, between memory cells 204 and a subsequently formed conductive substrate layer. Program dielectrics 210 are preferably grown upon the upper surfaces of memory cells 204 using wet or dry oxidation methods. As such, program dielectrics 210 preferably are composed of an oxide of the material(s) of which memory cells 204 are composed; in an embodiment in which the memory cells are composed of polysilicon, the program dielectrics are composed of silicon dioxide. Nitrogen may also be incorporated into the ambient in which program dielectrics 210 are grown such that the program dielectrics are composed of silicon oxynitride. Alternately, program dielectrics 210 may be formed from a variety of high dielectric constant materials. Suitable high dielectric constant materials may include silicon nitride, tantalum pentoxide, platinum oxide, chromium oxide, potassium oxide, and strontium oxide. Program dielectrics 210 may also be composed of composites of several dielectric materials.

Regardless of the material(s) of which program dielectrics 210 are composed, they preferably have an effective capacitance per unit area equivalent to an oxide layer 20–80 angstroms thick; that is, the capacitance-determining parameters of program dielectrics 210 (e.g., thickness and dielectric constant) are preferably such that the dielectrics have a capacitance per unit area equivalent to a silicon oxide dielectric layer 20–80 angstroms thick.

As shown in FIG. 8a, each program dielectric 210 preferably has a lateral dimension equivalent to a lateral dimension of an underlying memory cell, such that the program dielectrics do not extend over intracell dielectric layer 206. Because growth of program dielectrics 210 upon memory cells 204 may occur both into and away from the memory cells, program dielectrics 210 preferably extend above the upper surface of intracell dielectric layer 206. In an alternate embodiment, program dielectrics 210 may be blanket deposited over memory cells 204 and intracell dielectric layer 206 (thus extending beyond the lateral dimensions of the memory cells), and then photolithographically patterned to produce a structure similar to that shown in FIG. 8a.

Figure 9:
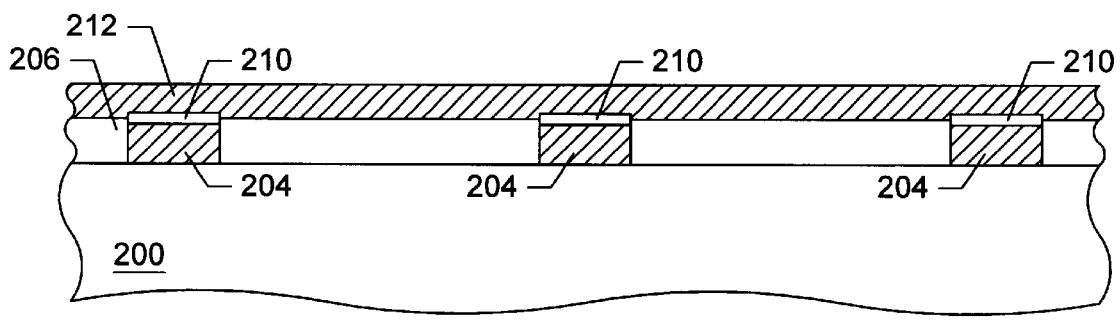

FIG. 9 depicts a partial cross-sectional view of a subsequent processing step in which first conductive substrate layer 212 is deposited above, and preferably upon, program dielectrics 210 and intracell dielectric layer 206. First conductive substrate layer 212 is preferably composed of polysilicon, but may also be composed of other conductive or potentially conductive materials, such as any of a variety of metals. First conductive substrate layer 212 is preferably formed by CVD deposition of polysilicon. Suitable CVD techniques include low-pressure chemical vapor deposition ("LPCVD") from a silane source. After being deposited, first conductive substrate layer 212 may be slightly polished to improve planarity. First conductive substrate layer 212 is preferably deposited at a thickness sufficient to allow the layer to serve as a source and destination of electrons during programming and erasure, respectively, of memory cells 204. In an embodiment, first conductive substrate layer 212 is relatively thin (e.g., 100–200 angstroms thick). If necessary, first conductive substrate layer 212 may be polished to achieve the desired thickness.

Figure 10:
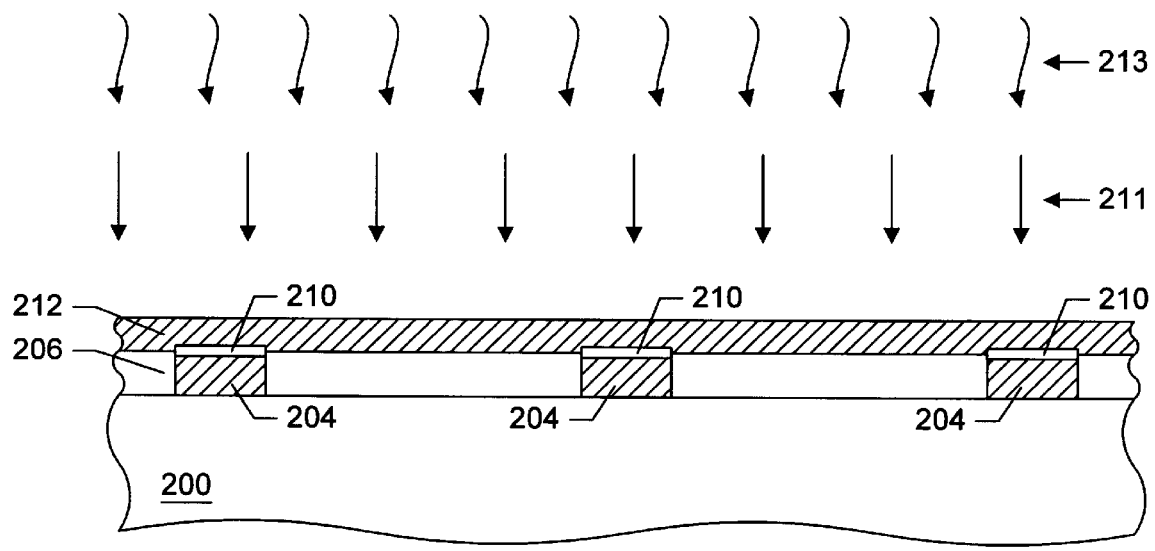
FIG. 10 is a partial cross-sectional view of the microelectronic topography, in which dopants are introduced into the first conductive substrate layer and the microelectronic topography is exposed to thermal radiation according to a processing step subsequent to FIG. 9.

FIG. 10 depicts a partial cross-sectional view of a subsequent processing step in which dopants are introduced into the first conductive substrate layer and the microelectronic topography is exposed to thermal radiation. First conductive substrate layer 212 is preferably doped with n- or p-type dopants either concurrent with or subsequent to its deposition. In the embodiment shown in FIG. 10, impurities 211 are introduced into first conductive substrate layer 212 via ion implantation. Alternately, the first conductive substrate layer may be doped concurrently with its deposition, or in situ. Of course, if first conductive substrate layer 212 is composed of a metal, then doping of the layer is preferably not performed.

Subsequently, the microelectronic topography may be annealed by exposure to thermal radiation 213. Annealing of the microelectronic topography may be performed in a Rapid Thermal Annealing ("RTA") chamber or a tube furnace. The annealing process preferably repairs any implant damage resulting from previous ion implantation steps, e.g., ion implantation into first conductive substrate layer 212. The annealing step shown in FIG. 10 may be used in addition to or in place of previous annealing steps.

Figure 11:
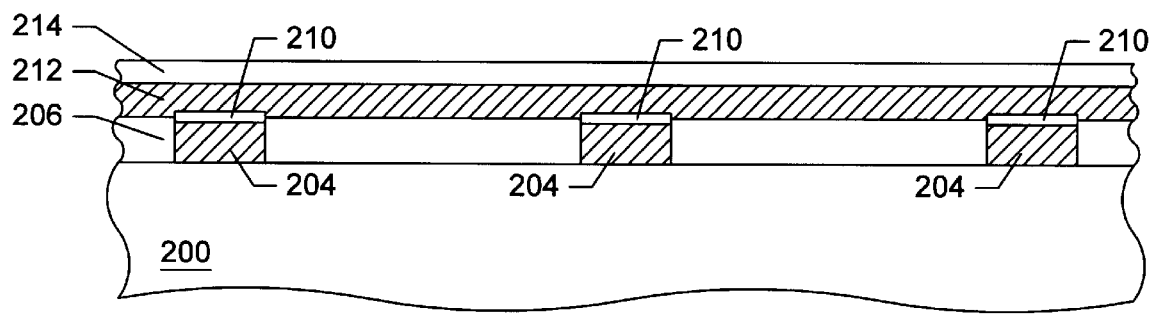
FIG. 11 is a partial cross-sectional view of the microelectronic topography, in which an intersubstrate dielectric layer is formed upon the first conductive layer according to a processing step subsequent to FIG. 10.

FIG. 11 depicts a partial cross-sectional view of a subsequent processing step in which an intersubstrate dielectric layer is formed upon the first conductive layer. Intersubstrate dielectric layer 214 is preferably configured to provide dielectric isolation between (i.e., to insulate) memory cells 204 and subsequently formed transistors during operation of the final integrated circuit. In other words, intersubstrate dielectric layer 214 is preferably thick enough to prevent voltages applied to devices (e.g., memory cells 204) below the layer from interfering with operation of devices (e.g., overlying transistors) arranged above the layer. Preferably, the intersubstrate dielectric layer is at least 1000 angstroms thick. Intersubstrate dielectric layer 214 is preferably formed by CVD or sputter deposition methods. Intersubstrate dielectric layer 214 is preferably composed of silicon dioxide, but may be alternatively composed of a variety of dielectric materials, including low dielectric constant materials such as HSQ.

Figure 12:
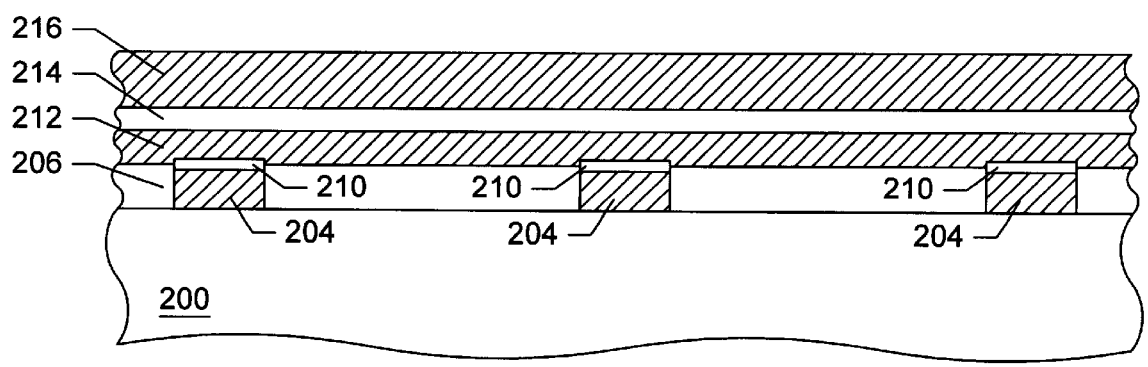
FIG. 12 is a partial cross-sectional view of the microelectronic topography, in which a second conductive substrate layer is formed upon the intersubstrate dielectric layer according to a processing step subsequent to FIG. 11.

FIG. 12 depicts a partial cross-sectional view of a subsequent processing step in which a second conductive substrate layer is deposited above, and preferably upon, intersubstrate dielectric layer 214. Second conductive substrate layer 216 is preferably composed of polysilicon, but may also be composed of other conductive or potentially conductive materials, such as any of a variety of metals. Second conductive substrate layer 216 is preferably formed by CVD deposition of polysilicon. Suitable CVD techniques include low-pressure chemical vapor deposition ("LPCVD") from a silane source. After being deposited, second conductive substrate layer 216 may be slightly polished to improve planarity. Second conductive substrate layer 216 is preferably deposited at thickness sufficient to allow the layer to function as a semiconducting substrate for subsequently formed transistors. Second conductive substrate layer 216 may be 200–2000 angstroms thick.

As noted above, the first conductive substrate layer may be made relatively thin. The second conductive substrate layer, however, may be significantly thicker than the first conductive substrate layer. For example, since transistor junctions will preferably be formed in second conductive substrate layer 216 in subsequent processing, second conductive substrate layer 216 is preferably sufficiently thick to allow complete formation of junctions therein. In an embodiment, second conductive substrate layer 216 is at least 2–10 times as thick as first conductive substrate layer 212. Thus, a segmented substrate may be formed that includes first conductive substrate layer 212, intersubstrate dielectric layer 214, and second conductive substrate layer 216.

Figure 13:
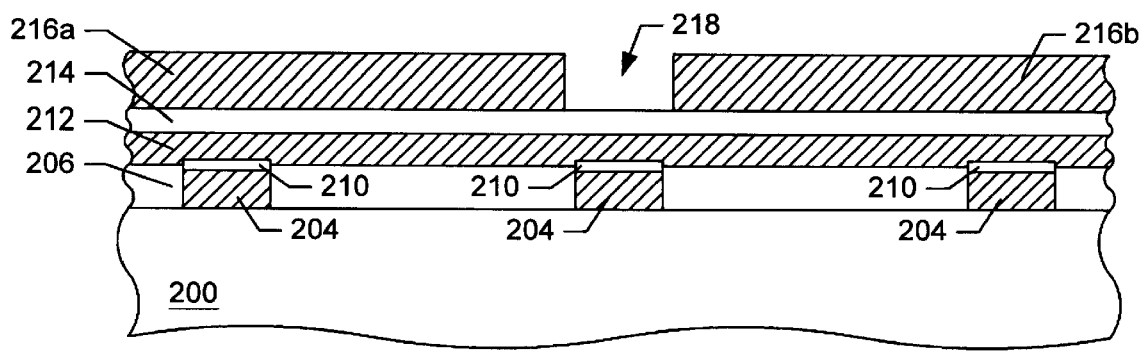
FIG. 13 is a partial cross-sectional view of the microelectronic topography, in which an isolation trench is etched into the second conductive substrate layer according to a processing step subsequent to FIG. 12.
Figure 14:
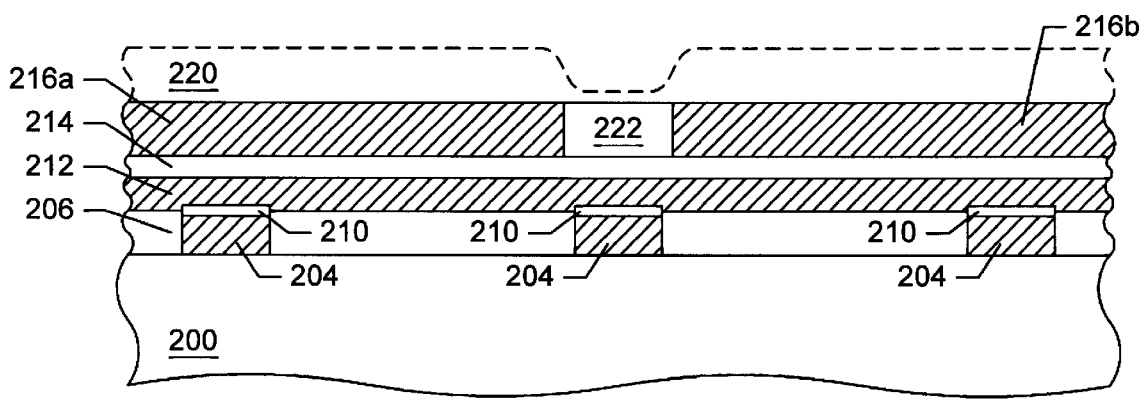
FIG. 14 is a partial cross-sectional view of the microelectronic topography, in which a trench fill material is deposited into the isolation trench and planarized according to a processing step subsequent to FIG. 13.

FIG. 13 depicts a partial cross-sectional view of a subsequent processing step in which an isolation trench is etched into the second semiconductor substrate. Isolation trench 218 may be patterned into second conductive substrate layer 216 using appropriately configured photolithography techniques. Isolation trench 218 is preferably etched such that it extends from the upper surface of second conductive substrate layer 216 to the upper surface of intersubstrate dielectric layer 214. As such, isolation trench 218 preferably separates a first segment 216a of the second conductive substrate layer from a second segment 216b of the second conductive substrate layer. By forming an isolation trench that extends entirely through the second conductive substrate layer to an underlying dielectric layer (e.g., intersubstrate dielectric layer 214), more effective isolation of adjacent active areas may be obtained. Then as shown in FIG. 14, a trench fill material 220 may be deposited into isolation trench 218 and planarized (e.g., by CMP techniques) to form isolation dielectric 222. Trench fill material 220 is preferably a dielectric such as silicon dioxide.

Figure 15:
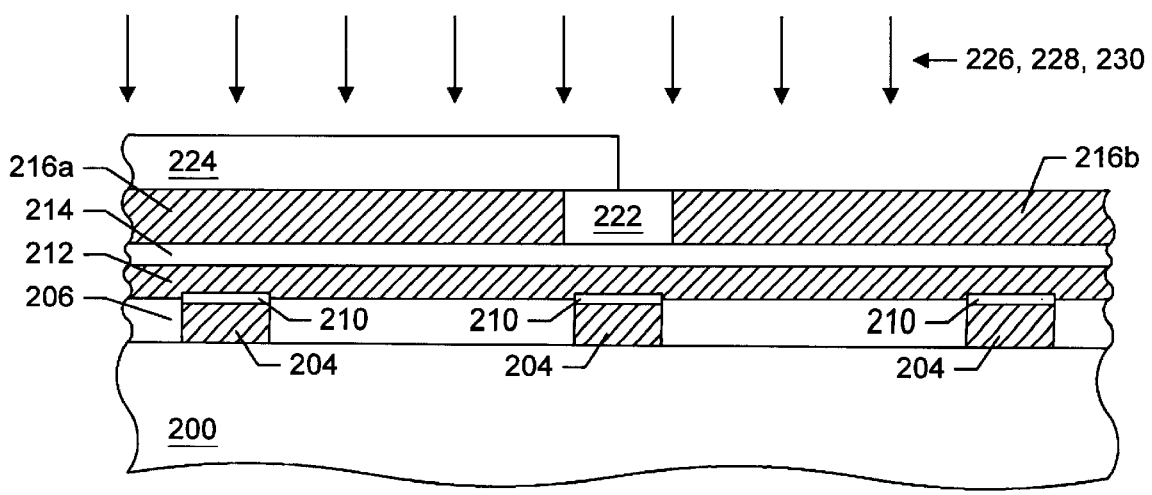
FIG. 15 is a partial cross-sectional view of the microelectronic topography, in which a masking layer is formed above a first segment of the second conductive substrate layer and well, threshold adjust, and punchthrough dopants are successively implanted into a second segment of the second conductive substrate layer according to a processing step subsequent to FIG. 14.

FIG. 15 depicts a partial cross-sectional view of a subsequent processing step in which masking layer 224 is formed above first segment 216a of the second conductive substrate layer. Masking layer 224 is preferably composed of photoresist that has been appropriately spun on, exposed, and developed to mask first segment 216a while exposing second segment 216b. Subsequently, well dopants 226, threshold adjust dopants 228, and punchthrough dopants 230 may be successively implanted into second segment 216b of second conductive substrate layer 216.

Figure 16:
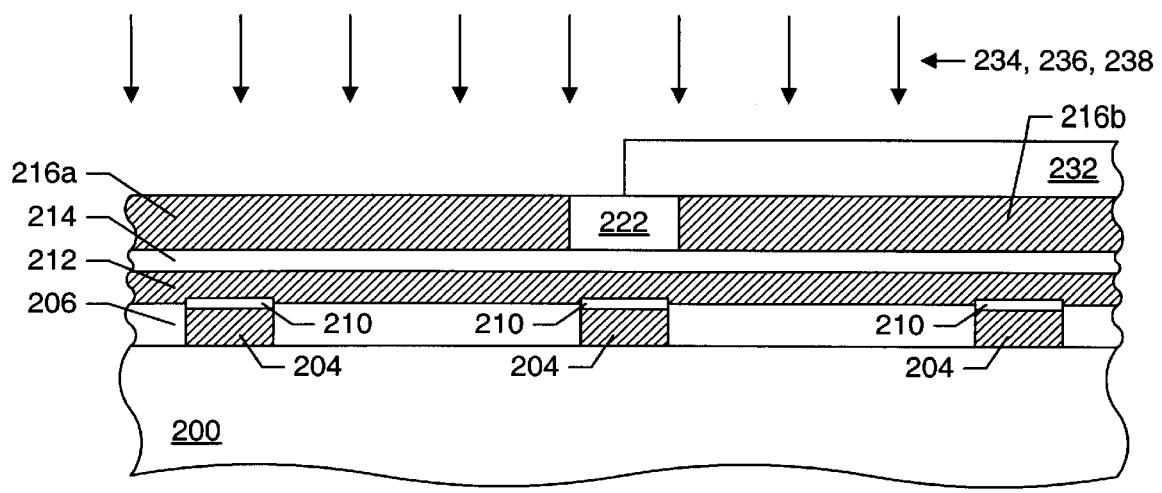
FIG. 16 is a partial cross-sectional view of the microelectronic topography, in which a masking layer is formed above the second segment of the second conductive substrate layer and well, threshold adjust, and punchthrough dopants are successively implanted into the first segment of the second conductive substrate layer according to a processing step subsequent to FIG. 15.

FIG. 16 depicts a partial cross-sectional view of a subsequent processing in which masking layer 232 is formed above second segment 216b of the second conductive substrate layer. Masking layer 332 is preferably composed of photoresist that has been appropriately spun on, exposed, and developed to mask second segment 216b while exposing first segment 216a. Subsequently, well dopants 234, threshold adjust dopants 236, and punchthrough dopants 238 may be successively implanted into first segment 216a of second conductive substrate layer 216. It should be understood, however, that it may only be necessary to perform a well implant into one of the first and second segments (e.g., the second conductive substrate layer may be doped during or immediately after deposition, which may serve as the background doping for one of the transistors in a CMOS design).

Figure 17:
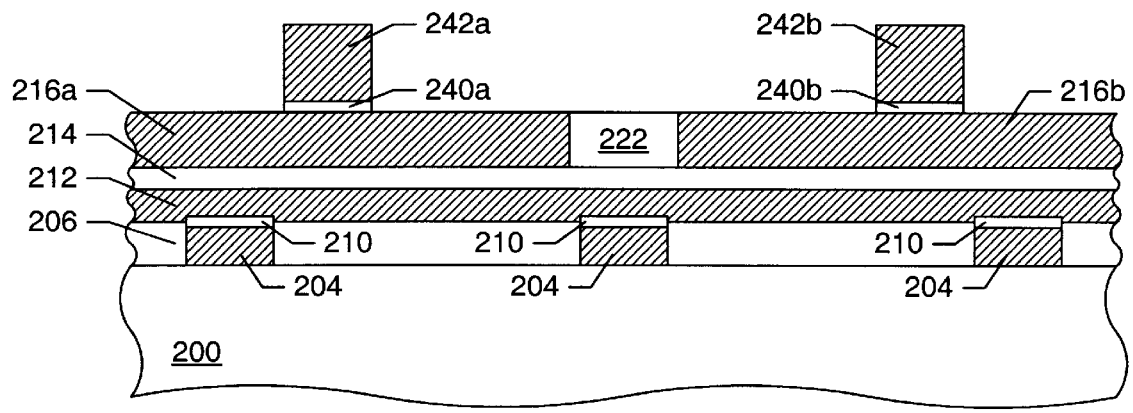
FIG. 17 is a partial cross-sectional view of the microelectronic topography, in which first and second segment gate conductors and dielectrics are formed above the first and second segments, respectively, of the second conductive substrate layer according to a processing step subsequent to FIG. 16.

FIG. 17 depicts a partial cross-sectional view of a subsequent processing step, in which first and second segment gate conductors and dielectrics are formed above the first and second segments, respectively, of the second conductive layer. In an embodiment, first segment gate dielectric 240a and first segment gate conductor 242a, as well as second segment gate dielectric 240b and second segment gate conductor 242b, may be fabricated by growing a gate dielectric layer (e.g., of silicon dioxide) upon the first segment 216a and second segment 216b, depositing a gate polysilicon layer upon the gate dielectric layer, and then patterning both layers to create the structures shown in FIG. 17. Alternately, patterning of a gate dielectric layer may be reserved for after junction implantation.

Figure 18:
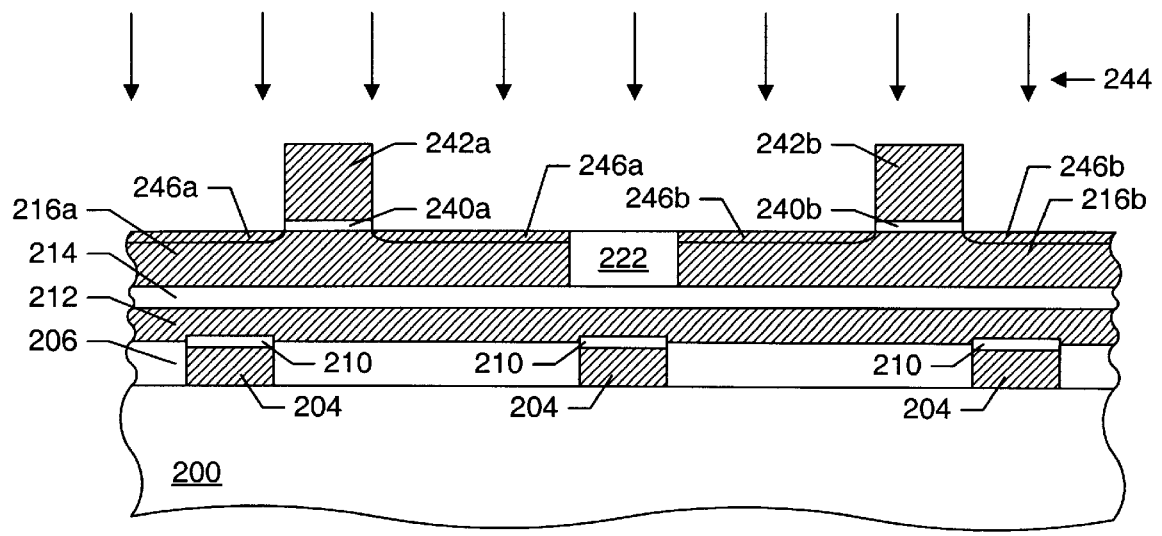
FIG. 18 is a partial cross-sectional view of the microelectronic topography, in which dopants are implanted into lightly-doped drain (LDD) regions of the first and second segments of the second conductive substrate layer according to a processing step subsequent to FIG. 17.

FIG. 18 depicts a partial cross-sectional view of a subsequent processing step in which dopants are implanted into lightly-doped drain (LDD) regions of the first and second segments of the second conductive layer. Implantation of LDD dopants 244 preferably forms first segment LDD regions 246a having interior lateral boundaries adjacent to, and preferably aligned with, sidewalls of first segment gate conductor 242a. Likewise, implantation of LDD dopants 244 preferably forms second segment LDD regions 246b adjacent to, and preferably aligned with, sidewalls of second segment gate conductor 246b. While not specifically shown in FIG. 18, it should be understood that the implantation step shown may be performed by implanting one type of dopants (e.g., arsenic) into the first segment 216a while masking second segment 216b, and then subsequently implanting a second type of dopant (e.g., boron) into second segment 216b while masking first segment 216a.

Figure 19:
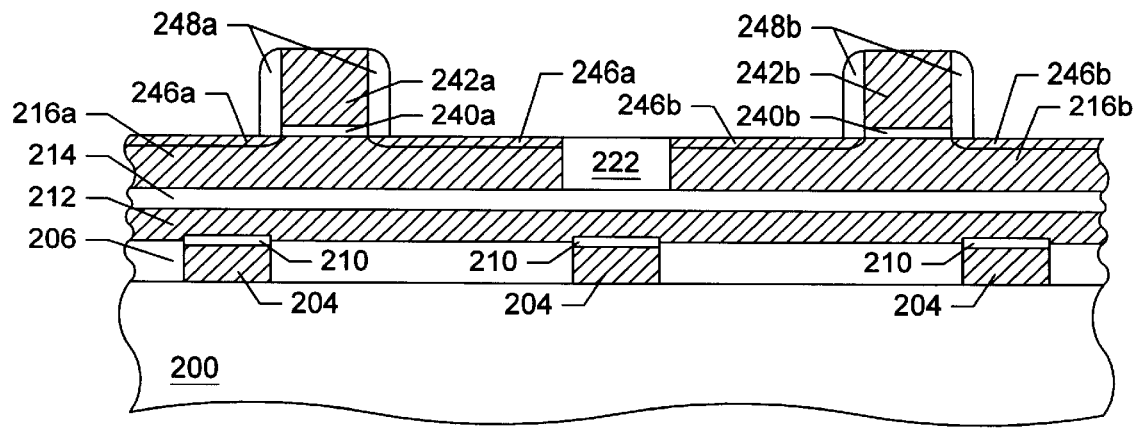
FIG. 19 is a partial cross-sectional view of the microelectronic topography, in which spacers are formed adjacent the sidewalls of the first segment and second segment gate conductors according to a processing step subsequent to FIG. 18.

FIG. 19 depicts a partial cross-sectional view of a subsequent processing step in which spacers are formed on the sidewalls of the first segment and second segment gate conductors. First segment spacers 248a and second segment spacers 248b may be formed by, e.g., conformably depositing a dielectric layer over the first and second segments, and then performing an anisotropic etching step (preferably with a high degree of directionality) that leaves spacers on the respective sidewalls of first segment gate conductor 248a and second segment gate conductor 248b.

Figure 20:
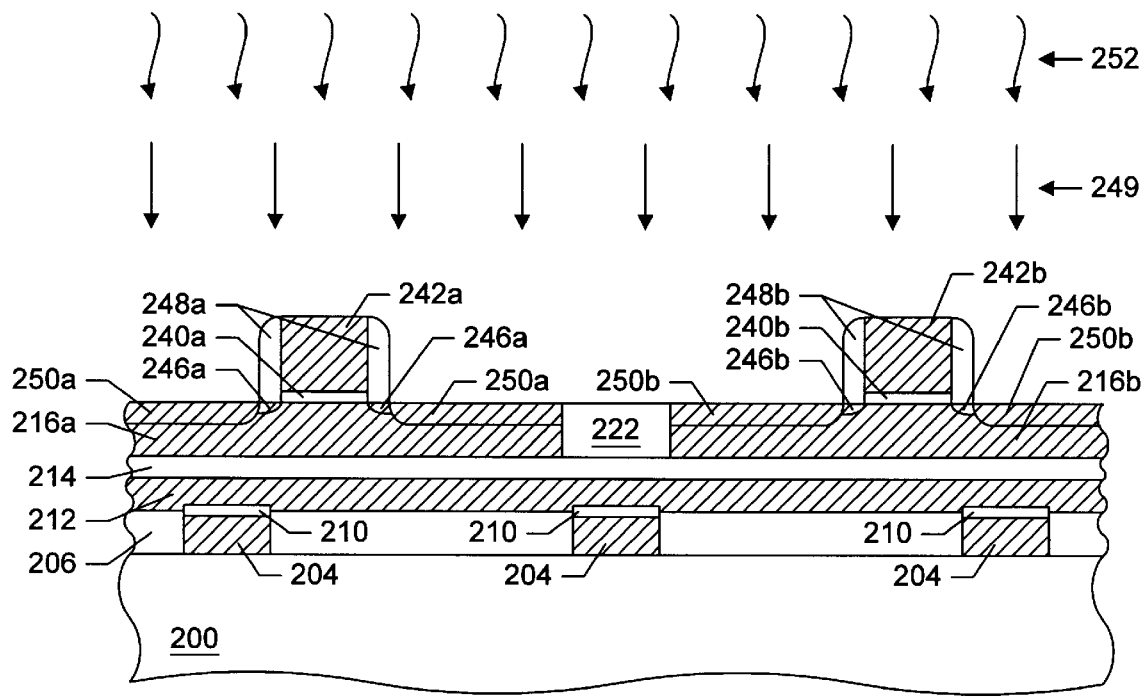
FIG. 20 is a partial cross-sectional view of the microelectronic topography, in which dopants are implanted into source/drain regions of the first and second segments of the second conductive substrate layer and the microelectronic topography is exposed to thermal radiation according to a processing step subsequent to FIG. 19.

FIG. 20 depicts a partial cross-sectional view of a subsequent processing step in which dopants are implanted into source/drain regions of the first and second segments of the second conductive substrate layer. Implantation of source/drain dopants 249 preferably forms first segment source/drain regions 250a adjacent to, and preferably aligned with, sidewalls of first segment spacers 248a. Likewise, implantation of source/drain dopants 249 preferably forms second segment source/drain regions 250b having interior lateral boundaries adjacent to, and preferably aligned with, sidewalls of second segment spacers 248b. While not specifically shown in FIG. 20, it should be understood that the implantation step shown may be performed by implanting one type of dopants (e.g., arsenic) into the first segment 216 while masking second segment 216b, and then subsequently implanting a second type of dopant (e.g., boron) into second segment 216b while masking first segment 216a. The dopants 249 are preferably implanted at a higher implant energy and with a higher implant dose than dopants 244. First segment spacers 248a and second segment spacers 248b are used to mask portions of the second conductive substrate immediately adjacent the first and segment gate conductors, thus preferably substantially confining LDD regions 246a and 246b to those portions.

Subsequently, the microelectronic topography may be annealed by exposure to thermal radiation 252. Annealing of the microelectronic topography may be performed in a Rapid Thermal Annealing ("RTA") chamber or a tube furnace. The annealing process preferably repairs any implant damage resulting from previous ion implantation steps, e.g., ion implantation for junction formation. The annealing step shown in FIG. 20 may be used in addition to or in place of previous annealing steps.

In such a manner, a first segment transistor may be formed upon within first segment 216a, and a second segment transistor may be formed upon within second segment 216b. At least one of the junctions of both the first and second segment transistors is preferably arranged adjacent to a sidewall of isolation trench 218. For example, as shown in FIG. 20, source/drain regions 250a and 250b may be adjacent to isolation trench 218.

Programming, erasure, and reading of memory cells 204 may be accomplished in several ways. In an embodiment, programming of memory cell 204 may involve applying a positive potential to memory cells to be programmed while grounding first conductive substrate layer 212 to induce the tunneling of electrons from the first conductive substrate layer through the program dielectric and to a memory cell or cells to which a positive potential is applied. Preferably, several of memory cells 204 may be selectively programmed individually or concurrently. The dielectric isolation provided by, e.g., intracell dielectric layer 206, preferably facilitates selective programming of one or more of memory cells 204 without substantially altering a charge level on any other, possibly adjacent, memory cells which are not to be programmed.

Conversely, erasure of the memory cell may involve applying a positive potential to first conductive substrate layer 212 while grounding memory cells 204 to induce tunneling of electrons from the memory cells though the program dielectric(s) and back to first conductive substrate layer 212. Because of the configuration of memory cells 204, all memory cells in tunneling contact with first conductive substrate layer 204 are preferably concurrently erased. The state of a particular memory cell 204 may be read by sensing the charge on the memory cell at a given moment in time. Each of memory cells 204 may be used to store one bit, and the charge level read from a cell may be used to determine whether a cell represents a "1" or a "0" at a given point in time.

The first and second segment transistors are preferably MOSFETs, and thus their operation will be apparent to those of ordinary skill in the art having the benefit of this disclosure. The transistors may be operated independently of or concurrently with memory cell 204.

Figure 8B:
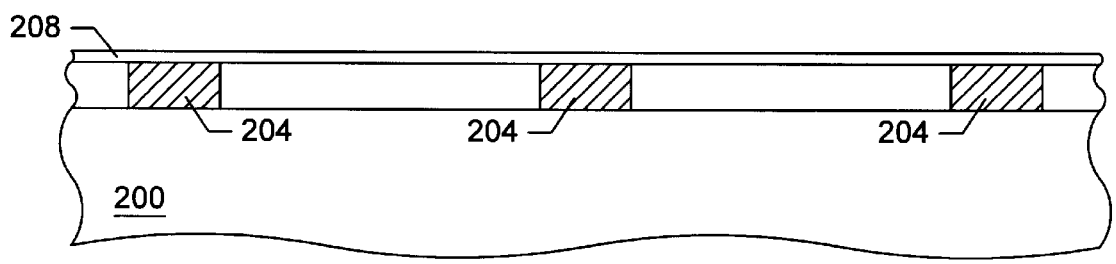
FIG. 8b is a partial cross-sectional view of the microelectronic topography, in which a program dielectric is deposited upon the plurality of memory cells and the intracell dielectric layer according to a processing step subsequent to FIG. 7.

In an alternate embodiment, a program dielectric may be formed that extends upon and between multiple ones of memory cells 204 instead of forming several discrete program dielectrics upon each memory cell 204 (as shown in FIG. 8a). FIG. 8b depicts a partial cross-sectional view of a processing step subsequent to FIG. 7 in which a program dielectric is deposited upon memory cells 204 and intracell dielectric layer 206. Program dielectric 208 is preferably formed by blanket or sputter deposition. Program dielectric 208 may be formed of similar materials as program dielectrics 210, and is preferably composed of a high dielectric constant material. Program dielectric 208 may be configured to function similarly to program dielectrics 210.

Figure 21:
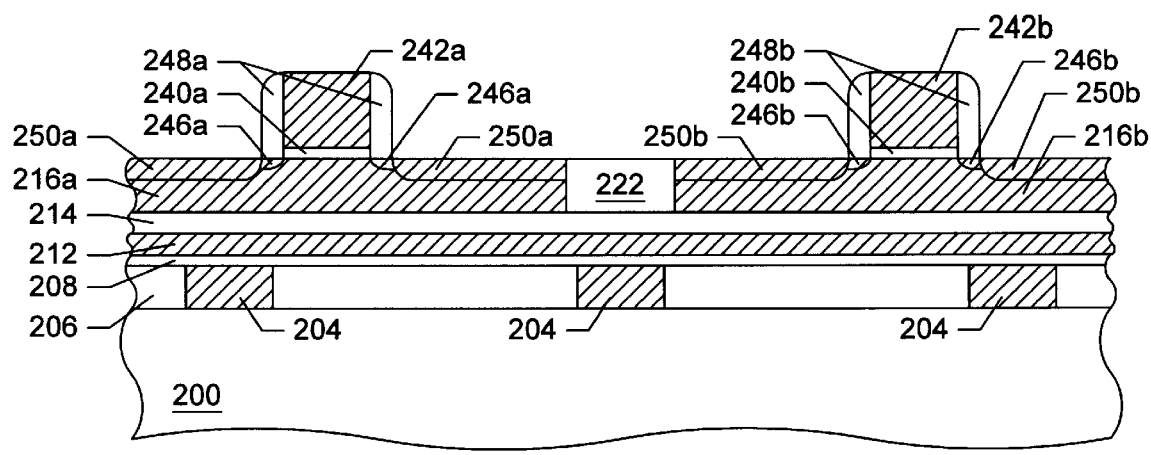
FIG. 21 is a partial cross-sectional view of the microelectronic topography, showing an alternate embodiment in which memory cells, a segmented substrate, and transistors are formed above the insulating base according to a processing sequence subsequent to FIG. 8b.

FIG. 21 depicts a partial cross-sectional view of a processing sequence subsequent to FIG. 8b in which a segmented substrate and transistors are formed above the memory cells. As shown in FIG. 21, the processing steps described above regard to FIGS. 9–20 may be continued as previously described to form the structure shown in FIG. 21.

As discussed above, in addition to serving as a substrate itself, the insulating base may be formed upon an underlying substrate. The composition of an underlying substrate for the insulating base depends largely on the intended function of the substrate. If devices such as transistors, resistors, or capacitors are to be formed in the substrate plane of the substrate, then the substrate is preferably composed of a semiconducting material. Suitable materials include silicon, silicon germanium, and gallium arsenide. Alternately, the substrate may be primarily intended as a support structure. In such a case, the primary requirement for the material of which the substrate is composed is that the material be compatible with any subsequent processing conditions. For example, the material should not melt in the temperature range in which subsequent steps will be carried out. Suitable materials include semiconducting materials such as those mentioned above, or non-semiconducting materials such as silicon dioxide and various metals.

FIG. 22 depicts a partial cross-sectional view of an embodiment in which a semiconducting substrate is to be used as an underlying substrate for insulating base 200. Semiconductor substrate 260, preferably composed of single-crystal silicon, is shown. During processing, active devices may be formed in active regions of semiconductor substrate 260 adjacent to an isolation structure formed in a field region of semiconductor substrate 260. In the embodiment depicted in FIG. 22, the isolation structure is trench isolation structure 264 and the active devices are MOS transistors 262a and 262b. In another embodiment, one or more of the active devices may be a memory cell. MOS transistors 262a and 262b may also be formed in a similar manner as the first segment and second segment transistors described above.

FIG. 23 presents a processing step in which an insulating base is formed above the semiconductor substrate. Insulating base 266 is preferably formed by depositing a dielectric material over substrate 260, and then polishing the dielectric material such that the upper surface of insulating base 266 is substantially planar. Insulating base 266 may be composed similarly to insulating base 200; for example, insulating base 266 may be composed of similar materials. Insulating base 266 is preferably configured to insulate any memory cells formed above the insulating base from the devices arranged below upon and within semiconductor substrate 260 so that interference therebetween may be avoided; that is, insulating base 266 is preferably composed such that a substantial transfer of electrons through the dielectric base layer, for example by means such as electron tunneling or hot electron injection, does not occur during operation (this prohibition does not include, of course, electron transfer through, e.g., a contact disposed in a via patterned in the insulating base). Preferably, insulating base 266 is 1000–5000 angstroms thick.

FIG. 24 depicts a partial cross-sectional view of a processing sequence subsequent to FIG. 23, in which memory cells, a segmented substrate, and transistors are formed above the insulating base. The processing steps described above regard to FIGS. 3–20 may be continued as previously described to form the structure shown in FIG. 24.

It should be understood that transistors and memory cells as provided herein may operate concurrently or separately. For example, a memory cell may be programmed or erased during switching of the transistor or while the transistor is inactive. In addition, the memory cell may be configured to store charge without activation of the transistor. Furthermore, no electrical connection between the memory cell and the transistor is required within the integrated circuit.

It should be also understood that the present disclosure provides a presently preferred embodiment for constructing and configuring one or more memory cells and transistors above an insulating base. However, a variety of manner for constructing and configuring such memory cells for use in, e.g., information storage and retrieval, and for configuring such transistors for, e.g., logic operations, will be apparent to one of ordinary skill in the art having the benefit of this disclosure.

It will be appreciated by those skilled in the art having the benefit of this disclosure that this invention is believed to provide an improved integrated circuit and method for fabricating such an integrated circuit. The present integrated circuit beneficially may be fabricated with greater device density at reduced cost. Further modifications and alternative embodiments of various aspects of the invention will be apparent to those skilled in the art in view of this description. For example, the segmented substrate is not required to have only a single dielectric layer between the two conductive substrate layers, but can also have one or more levels of devices arranged between the conductive substrate layers. As an illustration, such a space could include circuitry used to read, program, or erase the memory cells (e.g., sense amplifiers, word and bit line decoders), or interconnect leading to such circuitry. In addition, numerous other processing steps may be performed as part of fabrication of the integrated circuit that are not described herein (e.g., cleaning steps, passivation steps), the selection of which will be apparent to those of ordinary skill in the art having the benefit of the present disclosure. It is intended that the following claims be interpreted to embrace all such modifications and changes and, accordingly, the specification and drawings are to be regarded in an illustrative rather than a restrictive sense.

What is claimed is:

1. An integrated circuit, comprising:

a memory cell arranged above an insulating base;

a transistor arranged elevationally above the memory cell;

a first conductive substrate layer arranged above the memory cell and extending beyond the lateral dimensions of the memory cell; and a program dielectric arranged between the memory cell and the first conductive substrate layer and configured to allow electron transfer between the first conductive substrate layer and the memory cell during use.

2. The integrated circuit of claim 1, further comprising:

a second conductive substrate layer arranged above the first conductive substrate layer, wherein the transistor is arranged upon and within the second conductive substrate layer; and an intersubstrate dielectric layer interposed between the second conductive substrate layer and the first conductive substrate layer for insulating the second conductive substrate layer from the first conductive substrate layer.

3. The integrated circuit of claim 2, wherein the transistor comprises:

a gate dielectric arranged upon the second conductive substrate layer;

a gate conductor arranged upon the gate dielectric; and a pair of source/drain regions arranged within the second conductive substrate layer on opposite sides of said gate conductor, wherein interior lateral boundaries of each of said pair of source/drain regions are adjacent sidewalls of said gate conductor.

4. The integrated circuit of claim 2, wherein the first and second conductive substrate layers both comprise polysilicon, and wherein the second conductive substrate layer comprises a thickness at least 2–10 times greater than a thickness of the first conductive substrate layer.

5. The integrated circuit of claim 1, wherein the memory cell is arranged upon the insulating base and configured for non-volatile charge storage.

6. The integrated circuit of claim 5, wherein the insulating base extends beyond the lateral dimensions of the memory cell.

7. The integrated circuit of claim 1, wherein said insulating base comprises a semiconducting substrate.

8. The integrated circuit of claim 1, wherein said insulating bases comprises a non-semiconducting substrate.

9. An integrated circuit, comprising:

a plurality of memory cells arranged upon an insulating base;

a segmented substrate arranged above the plurality of memory cells, the segmented substrate comprising:

a first conductive substrate layer arranged above and dielectrically spaced from each of the plurality of memory cells;

a second conductive substrate layer arranged above the first conductive substrate layer;

an intersubstrate dielectric layer interposed between and in contact with the second conductive substrate layer and the first conductive substrate layer for dielectrically isolating the second conductive substrate layer from the first conductive substrate layer; and a plurality of transistors arranged upon and within the second conductive substrate layer.

10. The integrated circuit of claim 9, further comprising a program dielectric interposed between and in contact with at least one of the plurality of memory cells and the first conductive substrate layer.

11. The integrated circuit of claim 10, further comprising a plurality of program dielectrics arranged upon an upper surface of each of the plurality of memory cells and having lateral boundaries substantially equal to the lateral boundaries of respective underlying ones of the plurality of memory cells.

12. The integrated circuit of claim 10, further comprising a program dielectric extending upon and between each of the plurality of memory cells.

13. The integrated circuit of claim 10, further comprising an intracell dielectric layer arranged between each of the plurality of memory cells, the intracell dielectric layer being configured to dielectrically isolate adjacent ones of the plurality of memory cells.

14. The integrated circuit of claim 13, further comprising an isolation trench arranged within the second conductive substrate layer between adjacent ones of the plurality of transistors, wherein the isolation trench extends from an upper surface of the second conductive substrate layer to the intersubstrate dielectric layer, and wherein an isolation dielectric is arranged within the isolation trench.

15. The integrated circuit of claim 10, wherein the plurality of memory cells are configured such that electrons may be transferred from the first conductive substrate layer to one of the plurality of memory cells by application of a positive potential to said one of the plurality of memory cells for programming said one of the plurality of memory cells without substantially altering a charge level on the remainder of the plurality of memory cells.

16. The integrated circuit of claim 10, wherein the plurality of memory cells are configured such that that electrons may be concurrently transferred from each of the plurality of memory cells to the first conductive substrate layer for erasing the plurality of memory cells by application of a positive potential to the first conductive substrate layer.

17. The integrated circuit of claim 9, further comprising a semiconductor substrate upon which the insulating base is arranged, wherein a plurality of active devices is arranged upon and within active areas of the semiconductor substrate, and wherein said insulating base is sufficiently thick to substantially prevent electron transfer through the insulating base during use.

18. An integrated circuit, comprising:

a memory cell arranged upon and in contact with a non-semiconducting substrate; and a transistor arranged elevationally above the memory cell.

19. The integrated circuit of claim 18, further comprising:

a first conductive substrate layer arranged above the memory cell and extending beyond the lateral dimensions of the memory cell; and a program dielectric arranged between the memory cell and the first conductive substrate layer and configured to allow electron transfer between the first conductive substrate layer and the memory cell during use.

20. The integrated circuit of claim 19, further comprising:

a second conductive substrate layer arranged above the first conductive substrate layer, wherein the transistor is arranged upon and within the second conductive substrate layer; and an intersubstrate dielectric layer interposed between the second conductive substrate layer and the first conductive substrate layer for insulating the second conductive substrate layer from the first conductive substrate layer.

* * * * *